(12) United States Patent
Van Zwol et al.

(10) Patent No.: US 11,320,731 B2
(45) Date of Patent: May 3, 2022

(54) MEMBRANE FOR EUV LITHOGRAPHY

(71) Applicant: ASML NETHERLANDS B.V., Veldhoven (NL)

(72) Inventors: Pieter-Jan Van Zwol, Eindhoven (NL); Dennis De Graaf, Waalre (NL); Paul Janssen, Eindhoven (NL); Mária Péter, Eindhoven (NL); Marcus Adrianus Van De Kerkhof, Helmond (NL); Willem Joan Van Der Zande, Bussum (NL); David Ferdinand Vles, Eindhoven (NL); Willem-Pieter Voorthuijzen, 's-Hertogenbosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 134 days.

(21) Appl. No.: 16/060,635

(22) PCT Filed: Dec. 2, 2016

(86) PCT No.: PCT/EP2016/079594
§ 371 (c)(1),
(2) Date: Jun. 8, 2018

(87) PCT Pub. No.: WO2017/102379
PCT Pub. Date: Jun. 22, 2017

(65) Prior Publication Data
US 2019/0011828 A1 Jan. 10, 2019

(30) Foreign Application Priority Data

Dec. 14, 2015 (EP) ..................................... 15199845
Apr. 6, 2016 (EP) ..................................... 16163962

(51) Int. Cl.
*G03F 1/24* (2012.01)
*G03F 1/62* (2012.01)
*G03F 7/20* (2006.01)

(52) U.S. Cl.
CPC .................. *G03F 1/24* (2013.01); *G03F 1/62* (2013.01); *G03F 7/2008* (2013.01); *G03F 7/70916* (2013.01); *G03F 7/70983* (2013.01)

(58) Field of Classification Search
CPC ............ G03F 7/2008; G03F 1/24; G03F 1/62
See application file for complete search history.

(56) References Cited

U.S. PATENT DOCUMENTS 6,192,100 B1    2/2001   Acosta et al.
6,197,454 B1    3/2001   Yan
(Continued)

FOREIGN PATENT DOCUMENTS

CN    101088031    12/2007
CN    103901737     7/2014
(Continued)

OTHER PUBLICATIONS

International Search Report and Written Opinion issued for International Patent Application No. PCT/EP2016/079594, dated Feb. 21, 2017.
(Continued)

*Primary Examiner* — Daborah Chacko-Davis
(74) *Attorney, Agent, or Firm* — Pillsbury Winthrop Shaw Pittman, LLP

(57) ABSTRACT

A membrane for EUV lithography, the membrane having a thickness of no more than 200 nm and including a stack having: at least one silicon layer; and at least one silicon compound layer made of a compound of silicon and an element selected from the group consisting of boron, phosphorous, bromine.

22 Claims, 5 Drawing Sheets

(56) References Cited

U.S. PATENT DOCUMENTS

| | | | |
|---|---|---|---|
| 6,239,863 | B1 | 5/2001 | Catey et al. |
| 6,492,067 | B1 | 12/2002 | Klebanoff et al. |
| 7,105,047 | B2 | 9/2006 | Simmons et al. |
| 10,228,615 | B2 * | 3/2019 | Nikipelov ............ G03F 7/70958 |
| 10,539,886 | B2 | 1/2020 | Van Der Meulen et al. |
| 10,558,129 | B2 | 2/2020 | Kruizinga et al. |
| 2002/0192579 | A1 | 12/2002 | Kamono |
| 2003/0020894 | A1 | 1/2003 | Wang |
| 2005/0040345 | A1 | 2/2005 | Bakker et al. |
| 2010/0007869 | A1 | 1/2010 | Xu et al. |
| 2012/0140199 | A1 | 6/2012 | Hotzel |
| 2013/0065160 | A1 | 3/2013 | Lao |
| 2013/0250260 | A1 * | 9/2013 | Singh ........................ G03F 1/62 355/53 |
| 2014/0160455 | A1 | 6/2014 | Yakunin et al. |
| 2014/0187027 | A1 | 7/2014 | Xu et al. |
| 2014/0230694 | A1 | 8/2014 | Klamklang et al. |
| 2015/0192861 | A1 * | 7/2015 | Banine ..................... G21K 1/10 355/71 |
| 2015/0212433 | A1 | 7/2015 | Kim |
| 2015/0294998 | A1 | 10/2015 | Nihtianov et al. |
| 2015/0309405 | A1 | 10/2015 | Shih et al. |
| 2016/0033860 | A1 | 2/2016 | Wiley et al. |
| 2020/0012204 | A1 | 1/2020 | Van Der Meulen et al. |
| 2020/0057394 | A1 | 2/2020 | Kruizinga et al. |

FOREIGN PATENT DOCUMENTS

| | | |
|---|---|---|
| CN | 104797981 | 7/2015 |
| EP | 2 201 426 | 6/2010 |
| EP | 2 796 925 | 10/2014 |
| JP | 61-145936 | 9/1986 |
| JP | H10-198022 | 7/1998 |
| JP | 2005-043895 A | 2/2005 |
| JP | 2009-116284 A | 5/2009 |
| JP | 2009-151335 | 7/2009 |
| JP | 2010-256434 A | 11/2010 |
| JP | 2013-033813 | 2/2013 |
| JP | 2013-157636 | 8/2013 |
| JP | 2014-098913 | 5/2014 |
| JP | 2015-523611 A | 8/2015 |
| KR | 10-2015-0053684 | 5/2015 |
| TW | 201105555 | 2/2011 |
| WO | 2013/152921 | 10/2013 |
| WO | 2014/020003 | 2/2014 |
| WO | 2014/107476 A1 | 7/2014 |
| WO | 2014/188710 | 11/2014 |
| WO | 2016/001351 | 1/2016 |
| WO | 2017/012846 | 1/2017 |
| WO | 2017/102378 | 6/2017 |

OTHER PUBLICATIONS

Akiyama, et al., "Development of EUV Pellicle with Single Crystal Silicon Membrane," Shin-Etsu Chemical Co., Ltd., Advanced Functional Materials Research Center, 2010 International EUVL Symposium Kobe, Japan, Oct. 20, 2010, pp. 1-20.

Unknown, "Research Disclosure," Mason Publications, Hampshire, GB, vol. 620, No. 27, Dec. 1, 2015, 12 pgs.

Search Report and Written Opinion issued for corresponding Netherlands Patent Application No. 2020094, dated Jun. 27, 2018.

Office Action dated Apr. 2, 2020 issued in corresponding U.S. Appl. No. 16/060,837.

English translation of Office Action dated Jul. 27, 2020 issued in corresponding Taiwanese Patent Application No. 105141174.

Office Action dated Sep. 17, 2020 issued in corresponding Japanese Patent Application No. 2018-529227 with English translation.

Notice of Allowance dated Dec. 30, 2020, issued in corresponding U.S. Appl. No. 16/060,837.

Chinese office Action dated Jun. 17, 2021, issued in corresponding Chinese Patent Application No. 201680081498.6.

Notice of Reasons for Refusal dated Feb. 21, 2022, issued in corresponding Japanese Patent Application No. 2021-050642 with English translation (9 pgs ).

* cited by examiner

MEMBRANE FOR EUV LITHOGRAPHY

CROSS-REFERENCE TO RELATED APPLICATIONS

This application is the U.S. national phase entry of PCT patent application no. PCT/EP2016/079594, which was filed on Dec. 2, 2016, which claims the benefit of priority of European patent application no. 15199845.7, which was filed on Dec. 14, 2015, and European patent application no. 16163962.0, which was filed on Apr. 6, 2016, each of which is incorporated herein in its entirety by reference.

FIELD

The present invention relates to a membrane, a patterning device assembly and a dynamic gas lock assembly for EUV lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. A membrane assembly may be provided to protect the patterning device from airborne particles and other forms of contamination. The membrane assembly for protecting the patterning device may be called a pellicle. Contamination on the surface of the patterning device can cause manufacturing defects on the substrate. The membrane assembly may comprise a border and a membrane stretched across the border.

In use the membrane is required to be fixed relative to the patterning device by mounting features, for example. It is desirable to reduce the amount of space taken up by the mounting features. It is also desirable for the membrane to have a combination of high emissivity and a low possibility of failing.

SUMMARY OF THE INVENTION

According to an aspect of the invention, there is provided a membrane for EUV lithography, the membrane having a thickness of no more than 200 nm and comprising a stack comprising: at least one silicon layer; and at least one silicon compound layer made of a compound of silicon and an element selected from the group consisting of boron, phosphorous, bromine and sulphur.

According to an aspect of the invention, there is provided a membrane for EUV lithography, the membrane having a thickness of no more than 200 nm and comprising a stack comprising: at least one silicon layer; at least one capping layer comprising ruthenium at an external surface of the membrane; and at least one anti-migration layer comprising at least one of molybdenum and titanium adjacent to each capping layer.

According to an aspect of the invention, there is provided a membrane for EUV lithography, the membrane having a thickness of no more than 200 nm and comprising a stack comprising: at least one silicon layer and/or at least one silicon compound layer made of a compound of silicon and an element selected from the group consisting of boron, phosphorous, bromine and sulphur; and at least one capping layer at an external surface of the membrane, each capping layer comprising a material selected from the group consisting of a transition metal silicide, a transition metal boride, a transition metal carbide, a transition metal nitride and a transition metal oxide; and/or at least one transition metal layer between a capping layer and the silicon layer or silicon compound layer, each transition metal layer comprising a transition metal selected from the group consisting of Zr, Y, Mo, Cr, Hf, Ir, Mn, Nb, Os, Pd, Pt, Re, Rh, Ru, Ta, Ti, V and W.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
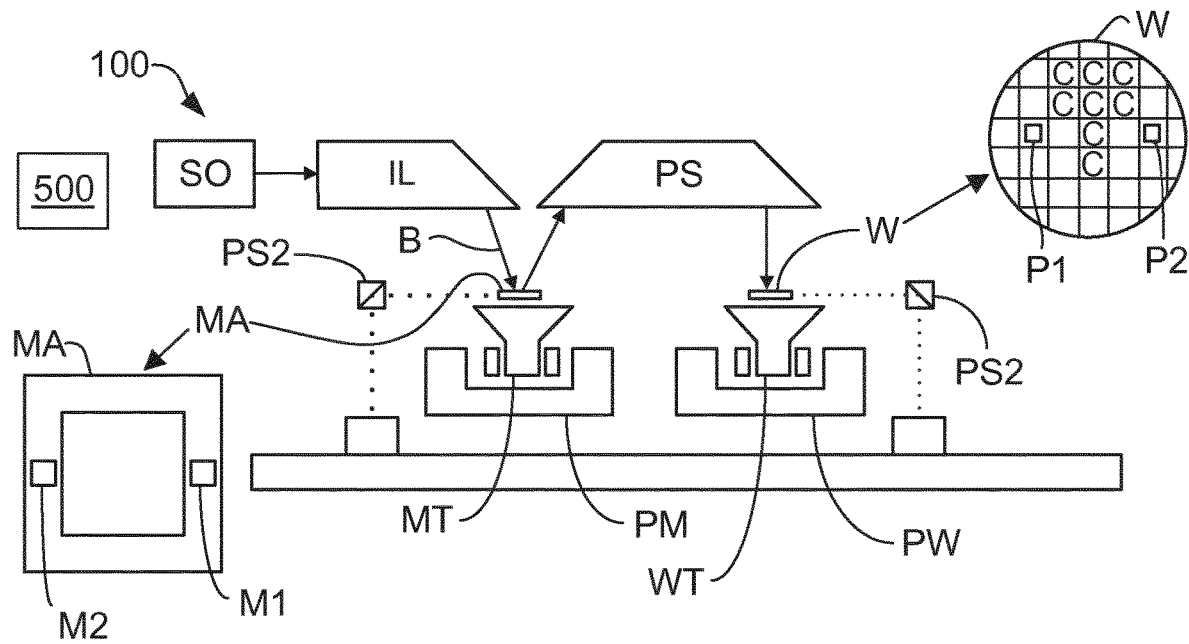
FIG. 1 depicts a lithographic apparatus according to an embodiment of the invention.

FIG. 1 schematically depicts a lithographic apparatus 100 including a source collector module SO according to one embodiment of the invention. The apparatus 100 comprises:
- an illumination system (or illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam B with a pattern in its cross-section such as to create a pattern in a target portion C of the substrate W. The pattern imparted to the radiation beam B may correspond to a particular functional layer in a device being created in the target portion C, such as an integrated circuit.

The patterning device MA may be transmissive or reflective. Examples of patterning devices include masks, programmable mirror arrays, and programmable liquid-crystal display (LCD) panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus 100 is of a reflective type (e.g., employing a reflective mask).

The lithographic apparatus 100 may be of a type having two (dual stage) or more substrate tables WT (and/or two or more support structures MT). In such a "multiple stage" lithographic apparatus the additional substrate tables WT (and/or the additional support structures MT) may be used in parallel, or preparatory steps may be carried out on one or more substrate tables WT (and/or one or more support structures MT) while one or more other substrate tables WT (and/or one or more other support structures MT) are being used for exposure.

Referring to FIG. 1, the illumination system IL receives an extreme ultraviolet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module SO may be separate entities, for example when a $CO_2$ laser is used to provide the laser beam for fuel excitation.

In such cases, the laser is not considered to form part of the lithographic apparatus 100 and the radiation beam B is passed from the laser to the source collector module SO with the aid of a beam delivery system comprising, for example, suitable directing mirrors and/or a beam expander. In other cases the source may be an integral part of the source collector module SO, for example when the source is a discharge produced plasma EUV generator, often termed as a DPP source.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system IL may be used to condition the radiation beam B, to have a desired uniformity and intensity distribution in its cross-section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. The patterning device (e.g., mask) MA and the substrate W may be aligned using mask alignment marks M1, M2 and substrate alignment marks P1, P2.

A controller 500 controls the overall operations of the lithographic apparatus 100 and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus 100. It will be appreciated that a one-to-one relationship between controlling computer and lithographic apparatus 100 is not necessary. In an embodiment of the invention one computer can control multiple lithographic apparatuses 100. In an embodiment of the invention, multiple networked computers can be used to control one lithographic apparatus 100. The controller 500 may also be configured to control one or more associated process devices and substrate handling devices in a lithocell or cluster of which the lithographic apparatus 100 forms a part. The controller 500 can also be configured to be subordinate to a supervisory control system of a lithocell or cluster and/or an overall control system of a fab.

Figure 2:
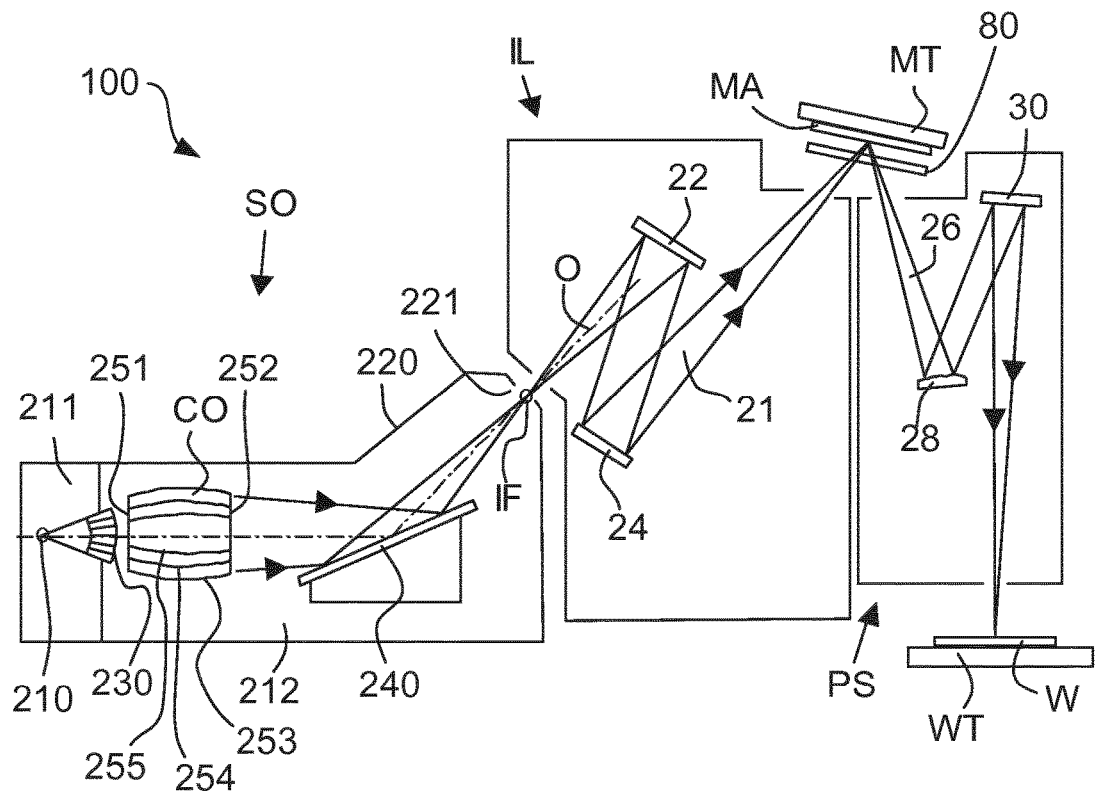
FIG. 2 is a more detailed view of the lithographic apparatus.

FIG. 2 shows the lithographic apparatus 100 in more detail, including the source collector module SO, the illumination system IL, and the projection system PS. An EUV radiation emitting plasma 210 may be formed by a plasma source. EUV radiation may be produced by a gas or vapor, for example Xe gas, Li vapor or Sn vapor in which the radiation emitting plasma 210 is created to emit radiation in the EUV range of the electromagnetic spectrum. In an embodiment, a plasma of excited tin (Sn) is provided to produce EUV radiation.

The radiation emitted by the radiation emitting plasma 210 is passed from a source chamber 211 into a collector chamber 212.

The collector chamber 212 may include a radiation collector CO. Radiation that traverses the radiation collector CO can be focused in a virtual source point IF. The virtual source point IF is commonly referred to as the intermediate focus, and the source collector module SO is arranged such that the virtual source point IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the unpatterned beam 21, at the patterning device MA, as well as a desired uniformity of radiation intensity at the patterning device MA. Upon reflection of the unpatterned beam 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in the illumination system IL and the projection system PS. Further, there may be more mirrors present than those shown in the Figures, for example there may be 1-6 additional reflective elements present in the projection system PS than shown in FIG. 2.

Alternatively, the source collector module SO may be part of an LPP radiation system.

As depicted in FIG. 1, in an embodiment the lithographic apparatus 100 comprises an illumination system IL and a projection system PS. The illumination system IL is configured to emit a radiation beam B. The projection system PS is separated from the substrate table WT by an intervening space. The projection system PS is configured to project a pattern imparted to the radiation beam B onto the substrate W. The pattern is for EUV radiation of the radiation beam B.

The space intervening between the projection system PS and the substrate table WT can be at least partially evacuated. The intervening space may be delimited at the location of the projection system PS by a solid surface from which the employed radiation is directed toward the substrate table WT.

In an embodiment the lithographic apparatus 100 comprises a dynamic gas lock. The dynamic gas lock comprises a membrane assembly 80. In an embodiment the dynamic gas lock comprises a hollow part covered by a membrane assembly 80 located in the intervening space. The hollow part is situated around the path of the radiation. In an embodiment the lithographic apparatus 100 comprises a gas blower configured to flush the inside of the hollow part with a flow of gas. The radiation travels through the membrane assembly before impinging on the substrate W.

In an embodiment the lithographic apparatus 100 comprises a membrane assembly 80. As explained above, in an embodiment the membrane assembly 80 is for a dynamic gas lock. In this case the membrane assembly 80 functions as a filter for filtering DUV radiation. Additionally or alternatively, in an embodiment the membrane assembly 80 is pellicle for the patterning device MA for EUV lithography. The membrane assembly 80 of the present invention can be used for a dynamic gas lock or for a pellicle or for another purpose such as a spectral purity filter. In an embodiment the membrane assembly 80 comprises a membrane 40, which may also be called a membrane stack. In an embodiment the membrane is configured to transmit at least 80% of incident EUV radiation.

Conceptually, an EUV membrane stack consist of one or more layers of materials, stacked in a certain order to fulfill functional requirements leading to an optimal membrane stack in terms of performance (through lifetime), reliability and costs. Layers having specific functional requirements may be selected for example from: a layer of core material (i.e. the core layer of the membrane or membrane stack), a layer for thermal emission enhancement, an oxidation barrier layer, an erosion barrier layer and/or a processing etch stop layer. It is possible that a single material layer fulfills multiple functional requirements (e.g. erosion barrier and emission enhancement in the case of Ru layers).

In an embodiment the membrane assembly 80 is configured to seal off the patterning device MA to protect the patterning device MA from airborne particles and other forms of contamination. Contamination on the surface of the patterning device MA can cause manufacturing defects on the substrate W. For example, in an embodiment the pellicle is configured to reduce the likelihood that particles might migrate into a stepping field of the patterning device MA in the lithographic apparatus 100.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time.

Figure 3:
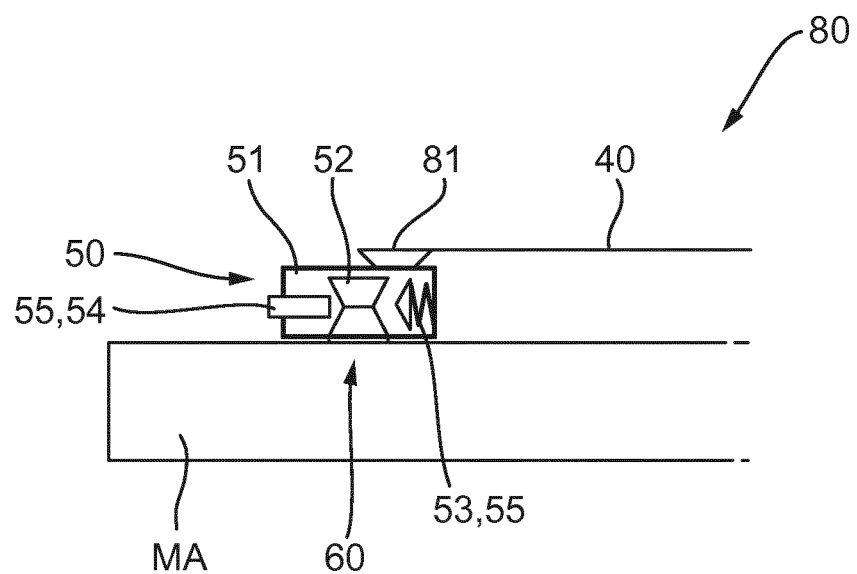
FIG. 3 schematically depicts, in cross-section, part of a membrane assembly according to an embodiment of the invention.

FIG. 3 schematically depicts, in cross-section, part of a membrane assembly 80 according to an embodiment of the invention. The membrane assembly 80 is for EUV lithography. The membrane assembly 80 comprises a membrane 40. The membrane 40 is emissive for EUV radiation. Of course the membrane 40 may not have 100% emissivity for EUV radiation. However, the membrane may have, for example, at least 50% emissivity. As shown in FIG. 3, in an embodiment the membrane 40 is substantially planar. In an embodiment the plane of the membrane 40 is substantially parallel to the plane of the patterning device MA.

The membrane assembly 80 has a shape such as a square, a circle or a rectangle, for example. The shape of the membrane assembly 80 is not particularly limited. The size of the membrane assembly 80 is not particularly limited. For example, in an embodiment the membrane assembly 80 has a diameter in the range of from about 100 mm to about 500 mm, for example about 200 mm.

As depicted in FIG. 3, in an embodiment the membrane assembly 80 comprises a border 81. The border 81 is configured to hold the membrane 40. The border 81 provides mechanical stability to the membrane 40. The border 81 is configured to reduce the possibility of the membrane 40 being deformed away from its planar shape. In an embodiment, a pre-tension is applied to the membrane 40 during its manufacture. The border 81 is configured to maintain the tension in the membrane 40 so that the membrane 40 does not have an undulating shape during use of the lithographic apparatus 100. In an embodiment the border 81 extends along the perimeter of the membrane 40. The outer periphery of the membrane 40 is positioned on top of the border 81 (according to the view of FIG. 3).

The thickness of the border 81 is not particularly limited. For example, in an embodiment the border 81 has a thickness of at least 300 µm, optionally at least 400 µm. In an embodiment the border 81 has a thickness of at most 1,000 µm, optionally at most 800 nm. In an embodiment the border 81 has a width of at least 1 mm, optionally at least 2 mm, optionally at least 4 mm. In an embodiment the border 81 has a width of at most 10 mm, optionally at most 5 mm, optionally at most 4 mm.

As depicted in FIG. 3, in an embodiment the membrane assembly 80 comprises a frame assembly 50. The frame assembly 50 is connected to the border 81. In an embodiment the frame assembly 50 is initially manufactured as a separate component from the border 81 and subsequently connected to the border 81. For example, the combination of the membrane 40 with the border 81 may be manufactured together, while the frame assembly 50 may be manufactured separately. In a subsequent manufacturing step, the frame assembly 50 may be attached or fixed to the border 81.

In an embodiment the frame assembly 50 has a width of at least 2 mm, optionally at least 5 mm, optionally at least 8 mm. In an embodiment the frame assembly 50 has a width of at most 20 mm, optionally at most 10 mm, optionally at most 8 mm.

In an embodiment the frame assembly 50 comprises a frame 51. The frame 51 is the part of the frame assembly 50 that is connected to the border 81. In an embodiment the frame 51 is made of the same material as the border 81. For example, in an embodiment both the border 81 and the frame 51 are made of a material comprising silicon. In an embodiment the border 81 is made of silicon. In an embodiment the frame 51 is made of silicon. In an embodiment the thermal expansion of the border 81 substantially matches the thermal expansion of the frame 51. In an embodiment the frame 51 is attached to the border 81 by an adhesive. In an embodiment the thermal expansion of the adhesive substantially matches the thermal expansion of the frame 51 and/or the border 81.

As depicted in FIG. 3, the frame assembly 50 is configured to attach to the patterning device MA. The frame assembly 50 is for holding the position of the membrane 40 relative to the patterning device MA. Although the embodiment is described with reference to a patterning device MA, the invention is equally applicable to a membrane assembly 80 that connects to a different component other than the patterning device MA.

In an embodiment the frame assembly 50 is connected to the border 81 in a direction perpendicular to the plane of the membrane 40. This is shown in FIG. 3. In FIG. 3, the plane of the membrane 40 extends left to right and into and out of the paper. The direction perpendicular to the plane of the membrane 40 corresponds to the vertical (i.e. up and down) direction in FIG. 3. The frame assembly 50 is connected directly below the border 81. The border 81 and the frame assembly 50 are aligned in the vertical direction in FIG. 3. In an embodiment the interface between the border 81 and the frame assembly 50 is in a plane that is substantially parallel to the plane of the membrane 40.

In an embodiment the membrane assembly 80 is configured to be removable from the patterning device MA. This allows intermediate inspections of the patterning device MA to take place. In an embodiment the frame assembly 50 is configured to be repeatedly attached to and detached from the patterning device MA.

In use, the frame assembly 50 is between the border 81 and the patterning device MA. This arrangement is different from arrangements in which the frame assembly is positioned radially outwards from the border. An embodiment of the invention is expected to achieve a reduction in space around the membrane 40 required to hold the membrane 40 in position relative to the patterning device MA.

According to a comparative example, a membrane assembly has a frame assembly radially outwards from the border. The frame assembly is required to be accessed in the radial direction so as to attach/detach the frame assembly to/from the patterning device. A space of about 16 mm may be required to accommodate the border, the frame assembly and space for accessing the frame assembly.

In contrast in an embodiment the frame assembly 50 is positioned below the border 81, thereby reducing radial space required to accommodate the border 81 and the frame assembly 50. For example, in an embodiment the radial space required to accommodate the border 81, the frame assembly 50 and space for accessing the frame assembly 50 is about 12 mm.

An embodiment of the invention is expected to achieve a reduction in the required space in the region of the patterning device MA for mounting features. Mounting features are features that are used to mount the membrane assembly 80 onto the patterning device MA. In an embodiment a mounting feature is provided between the border 81 and the patterning device MA. This is shown in FIG. 3 and will be explained in further detail below.

In an embodiment the frame assembly 50 comprises at least one hole 52. In an embodiment the hole 52 is a cavity or chamber within the frame 51 of the frame assembly 50. The hole 52 is configured to receive a stud 60. The stud 60 protrudes from the patterning device MA.

FIG. 3 shows the stud 60 fixed to the patterning device MA. In an embodiment the stud 60 is glued onto the patterning device MA using an adhesive. Alternatively, the stud 60 may be formed integrally with the patterning device MA. As a further alternative, the stud 60 may be initially manufactured as a separate component from the patterning device MA and subsequently fixed to the patterning device MA using means other than an adhesive, for example a screw.

The stud 60 and the hole 52 are mounting features. In an embodiment the stud 60 and the hole 52 are provided between the border 81 and the patterning device MA. This is different from previously known arrangements in which the mounting features are positioned radially outwards from the border 81.

As depicted in FIG. 3, in an embodiment the hole 52 at least partially overlaps the border 81 when viewed in the direction perpendicular to the plane of the membrane 40. This is shown in FIG. 3, where the hole 52 partially overlaps the border 81 when viewed in the vertical direction. Looking at FIG. 3, a vertical line can be drawn that extends through both the border 81 and the hole 52.

In an embodiment the frame assembly 50 comprises a locking mechanism 55. The locking mechanism 55 is configured to lock the frame assembly 50 to the stud 60. In an embodiment the locking mechanism 55 comprises a resilient member 53. In an embodiment the locking mechanism 55 comprises a resilient member 53 for each hole 52. In an embodiment the frame assembly 50 comprises a plurality of holes 52, for example two, three, four or more holes 52. A resilient member 53 is provided corresponding to each hole 52.

As depicted in FIG. 3, in an embodiment the resilient member 53 comprises a spring. For example, the spring may be a coil spring or a leaf spring. In an alternative embodiment the resilient member 53 comprises a resilient material such as rubber. In an alternative embodiment the resilient member 53 comprises a flexure. The flexure may be machined using an electrical discharge machining process, for example.

Figure 4:
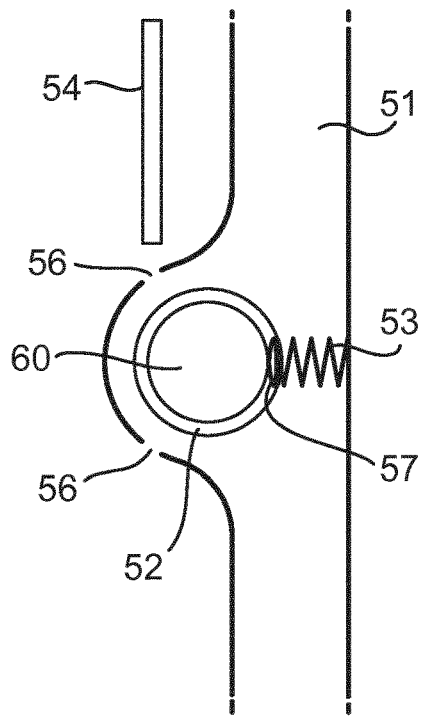
FIGS. 4 to 6 schematically depict, in plan, stages of using a locking mechanism of a membrane assembly according to an embodiment of the invention.
Figure 5:
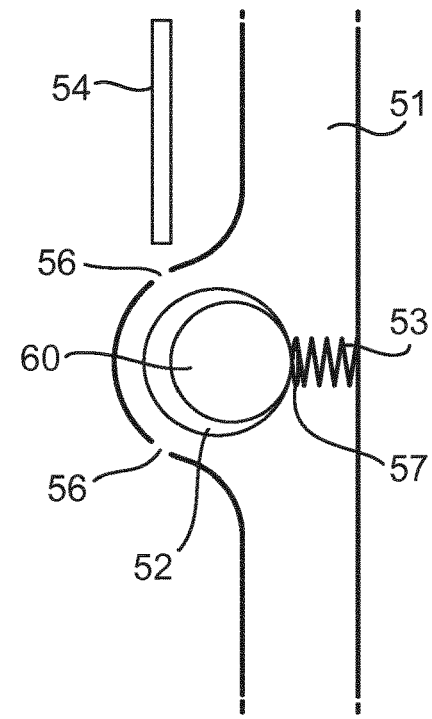
Figure 6:
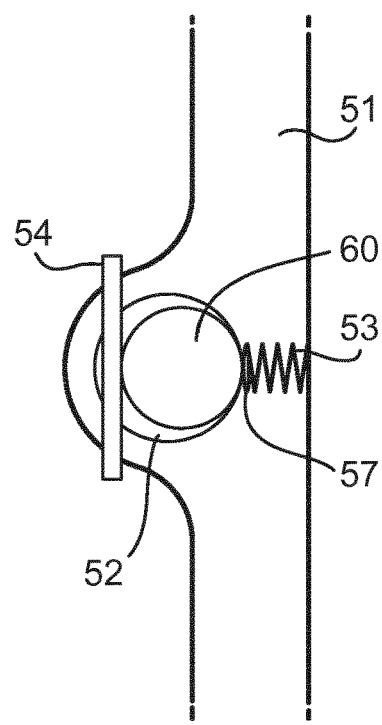

FIGS. 4 to 6 schematically depict stages of use of the locking mechanism 55. FIGS. 4 to 6 are shown in plan view. FIG. 4 depicts an initial state in which the frame assembly 50 is positioned over the stud 60 so that the stud 60 is received into the hole 52. The resilient member 53 is not compressed. As depicted in FIG. 4, the resilient member 53 extends into the hole 52. Accordingly, the stud 60 can come into contact with the resilient member 53 when the stud 60 is received into the hole 52. The resilient member 53 is configured to be compressible when the stud 60 received in the hole 52 presses against the resilient member 53 in a direction within the plane of the membrane 40. For example, in FIG. 4 the stud 60 can press against the resilient member 53 in the direction to the right in the Figure.

As depicted in FIGS. 3 to 6, in an embodiment the locking mechanism 55 comprises a locking member 54 for each hole 52. The locking member 54 is configured to be movable to a locking position where the locking member 54 extends into the hole 52. In the locking position the compressed resilient member 53 exerts a force on the stud 60 received in the hole 52 towards the locking member 54. This is shown in the sequence from FIG. 4 to FIG. 6.

As shown in the transition from FIG. 4 to FIG. 5, the stud 60 and the frame assembly 50 are moved relative to each other so that the stud 60 presses against the resilient member 53. The stud 60 compresses the resilient member 53, as shown in FIG. 5.

As shown in the transition from FIG. 5 to FIG. 6, the locking member 54 is moved to the locking position where the locking member 54 extends into the hole 52. For example, as shown in FIGS. 4 to 6, in an embodiment the frame assembly 50 comprises at least one locking aperture 56. The locking member 54 passes through the locking apertures 56.

FIG. 6 shows the locking member 54 in the locking position. The resilient member 53 exerts a force on the stud 60 in the direction of the locking member 54. In the situation shown in FIG. 5, an external force is required to be exerted on the frame assembly 50 and/or on the stud 60 so that the stud 60 compresses the resilient member 53. Once the locking member 54 is in the locking position (e.g. as shown in FIG. 6), it is no longer necessary for the external force to be applied. This is because the locking member 54 holds the stud 60 and the frame assembly 50 in position relative to each other.

As explained above, the stud 60 is positioned under the border 81, instead of radially outward of the border 81. This may require an increase in the distance (also known as standoff) between the patterning device MA and the membrane 40. The distance between the surface of the patterning device MA and the membrane 40 substantially corresponds to the combined height of the frame assembly 50 and the border 81. In an embodiment the combined height of the frame assembly 50 and the border 81 is at least 1 mm, at least 2 mm, and optionally at least 5 mm. In an embodiment the combined height of the frame assembly 50 with the border 81 is at most 20 mm, optionally at most 10 mm, and optionally at most 5 mm.

In an embodiment the resilient member 53 comprises a spring made of a material such as stainless steel. In an embodiment the resilient member 53 is connected to a contact pad 57 made of a different material from the resilient member 53. For example, the contact pad 57 may be made of the same material as the stud 60 and/or the locking member 54. In an embodiment the contact pad 57 comprises titanium. In an embodiment the locking member 54 comprises titanium. In an embodiment the stud 60 comprises titanium. Titanium is known to provide a ductile contact. However, in an alternative embodiment, other materials can be used for the contact pad 57, the stud 60 and the locking member 54.

As shown in FIGS. 4 to 6, in an embodiment the cross-sectional area of the hole 52 is greater than the cross-sectional area of the stud 60 in plan view. The hole 52 is oversized relative to the stud 60. In an embodiment the resilient member 53 is provided against an end stop (not shown in the Figures). The resilient member 53 protrudes into the hole 52 when viewed in plan view (as shown in FIG. 4). Accordingly, the resilient member 53 effectively reduces the cross-sectional area of the hole 52 in plan view. The remaining cross-sectional dimensions of the hole 52 are larger than the dimensions of the stud 60. Accordingly, the stud 60 can be received into the hole 52 when the frame assembly 50 is moved vertically over the stud 60. The frame assembly 50 is pushed sideways against the resilient member 53 so that the resilient member 53 is deflected inwards. The locking member 54 is placed preventing the frame assembly 50 from bending back. In an embodiment the locking member 54 is a pin. The locking member 54 can be inserted from the side or from the top. After the locking member 54 has been inserted, the frame assembly 50 is locked to the patterning device MA.

In an embodiment the frame assembly 50 comprises four holes 52 evenly distributed around the frame assembly 50. In an embodiment the frame assembly 50 has a similar shape to the border 81, following the perimeter of the membrane 40. FIG. 3 depicts the resilient member 53 radially inward of the hole 52. However, this is not necessarily the case. The resilient member 53 may be radially outward of the hole 52 or neither radially inward nor outward relative to the hole 52. The hole 52 is positioned between the resilient member 53 and the locking member 54.

In an embodiment a resilient member 53 is radially inward of a hole 52 at one side of the membrane assembly 80, whereas another resilient member 53 is radially outward of another hole 52 at the opposite side of the membrane assembly 80. This allows the studs 60 at opposite sides of the patterning device MA to compress both resilient members 52 with one movement of the membrane assembly 80 relative to the patterning device MA. In an embodiment the membrane assembly 80 is configured such that all of the studs 60 received in corresponding holes 52 compress corresponding resilient members 52 with one movement of the membrane assembly 80 relative to the patterning device MA.

As shown in FIGS. 4 to 6, in an embodiment the locking member 54 is provided as a loose part. In an alternative embodiment the locking member may be formed to be integral with the rest of the frame assembly 50, provided that the locking member 54 can be slid into the locking position.

In an embodiment the stud 60 has a diameter (in plan view) of at least 1 mm, optionally at least 2 mm, and optionally at least 3 mm. In an embodiment the stud 60 has a diameter of at most 10 mm, optionally at most 5 mm, and optionally at most 3 mm.

As explained above, in an embodiment the resilient member 53 extends into the hole 52 when it is not compressed. In an embodiment the resilient member 53 extends into the hole 52 by a distance of at least 0.1 mm, optionally at least 0.2 mm, and optionally at least 0.5 mm. In an embodiment the resilient member 53 extends into the hole 52 by a distance of at most 2 mm, optionally at most 1 mm, and optionally at most 0.5 mm.

As mentioned above, the hole 52 has a diameter that is larger than the diameter of the stud 60. In an embodiment the diameter of the hole is greater than the diameter of the stud 60 by at least 0.2 mm, optionally at least 0.5 mm, and optionally at least 1 mm. In an embodiment the diameter of the hole 52 is greater than the diameter of the stud 60 by at most 5 mm, optionally at most 2 mm, and optionally at most 1 mm. In an embodiment the locking member 54 has a length of at least 1 mm, optionally at least 2 mm, and optionally at least 4 mm.

In an embodiment the locking member 54 has a length of at most 10 mm, optionally at most 5 mm, and optionally at most 4 mm. In an embodiment the locking member 54 has a width of at least 0.2 mm, optionally at least 0.5 mm, and optionally at least 1 mm. In an embodiment the locking member 54 has a width of at most 5 mm, optionally at most 2 mm, and optionally at most 1 mm.

An embodiment of the invention is expected to achieve a reduction in tooling steps required for attaching/detaching the member assembly 80 to/from the patterning device MA.

Figure 7:
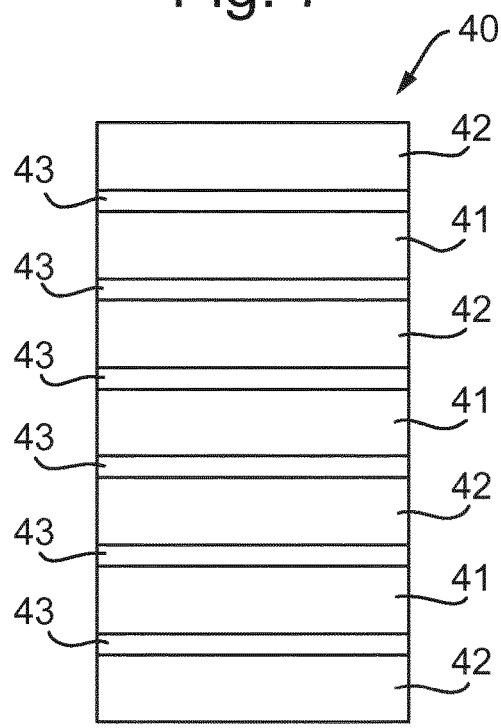
FIGS. 7 to 13 schematically depict, in cross-section, membranes according to different embodiments of the invention.

FIG. 7 schematically depicts, in cross-section, a membrane 40 according to an embodiment of the invention. As shown in FIG. 7, the membrane 40 comprises a stack. The stack comprises a plurality of layers.

In an embodiment the stack comprises at least one silicon layer 41. The silicon layer 41 comprises a form of silicon. In an embodiment the stack comprises at least one silicon compound layer 43. The silicon compound layer 43 is made of a compound of silicon and another element selected from the group consisting of boron, phosphorus, bromine and sulphur. However, other elements may also be used. In particular, in an embodiment the element that combines with the silicon to form the silicon compound layer 43 is any element that can be used as a dopant material for doping the silicon layer 41. The embodiment will be described with boron as the element that combines with the silicon, merely for convenience. The embodiment is not limited to the element being boron.

In an embodiment the silicon compound layer 43 comprises a silicon boride. Silicon boride has the chemical formula $SiB_x$, where x can be 3, 4, 6, 14, 15, 40 etc. Silicon boride has metallic properties. In particular, the silicon compound layer 43 has the property of metal that it increases the emissivity for EUV radiation of the membrane 40. A membrane made of only the silicon layer 41 would have a low emissivity, perhaps of the order of 3%. The emissivity dramatically increases if a metal or a compound that has metallic properties is added to the membrane 40.

Metals are known to limit the practical thickness of the membrane due to EUV absorption. By providing the silicon membrane layer 43, an embodiment of the invention is expected to achieve an increase in possible thickness of a membrane 40 that has sufficient emissivity for use in the lithographic apparatus 100.

As depicted in FIG. 7, in an embodiment the silicon compound layer 43 is formed as an interlayer between the silicon layer 41 and a non-metallic layer 42 comprising the element that combines with silicon to form the silicon compound layer 43. For example, in an embodiment the non-metallic layer 42 comprises boron. In an embodiment the boron is provided in the form of boron carbide. However alternative forms of boron can be used.

In an embodiment the silicon layer 41 is initially provided adjacent to the non-metallic layer 42. The boron in the non-metallic layer 42 locally dopes the silicon in the silicon layer 41. The boron dopes the silicon to the extent that silicon boride is produced to form the silicon compound layer 43. The boron dopes the silicon such that there are more boron atoms than silicon atoms in the doped silicon, i.e. forming silicon boride.

In an embodiment, silicon layers 41 and non-metallic layers 42 are provided as multilayers. Locally, boron silicide can strengthen the membrane 40 (by a laminate effect and by radiation hardening of boron in silicon) so that the membrane 40 can withstand higher temperatures.

As depicted in FIG. 7, in an embodiment the stack comprises a plurality of silicon layers 41, a plurality of non-metallic layers 42 and a silicon compound layer 43 between each pair of silicon layers 41 and a non-metallic layer 42.

As depicted in FIG. 7, in an embodiment the stack comprises layers in the following order: a non-metallic layer 42, a silicon compound layer 43, a silicon layer 41, a silicon compound layer 43, a non-metallic layer 42, a silicon compound layer 43, a silicon layer 41, a silicon compound layer 43, a non-metallic layer 42, a silicon compound layer 43, a silicon layer 41, a silicon compound layer 43 and a non-metallic layer 42. This is a multilayer stack. In an embodiment the stack may comprise a non-metallic layer 42 and then repeated cycles of a set of four layers comprising a silicon compound layer 43, a silicon layer 41, a silicon compound layer 43 and a non-metallic layer 42.

In an embodiment each non-metallic layer 42 has a thickness of at least 0.5 nm, optionally at least 1 nm and optionally at least 2 nm. In an embodiment each non-metallic layer 42 has a thickness of at most 10 nm, optionally at most 5 nm, and optionally at most 2 nm.

In an embodiment each silicon compound layer 43 has a thickness of at least 0.5 nm, optionally at least 1 nm, and optionally at least 2 nm. In an embodiment each silicon compound layer 43 has a thickness at most 10 nm, optionally at most 5 nm, and optionally at most 2 nm.

In an embodiment each silicon layer 41 has a thickness of at least 2 nm, optionally at least 5 nm, and optionally at least 8 nm. In an embodiment each silicon layer 41 has a thickness of at most 20 nm, optionally at most 10 nm, optionally at most 8 nm.

The embodiment depicted in FIG. 7 with silicon layers 41 of 8 nm thickness, non-metallic layers 42 of 2 nm thickness and silicon compound layers 43 of 2 nm thickness is expected to be achieve an emissivity for EUV radiation of about 90%.

Figure 8:
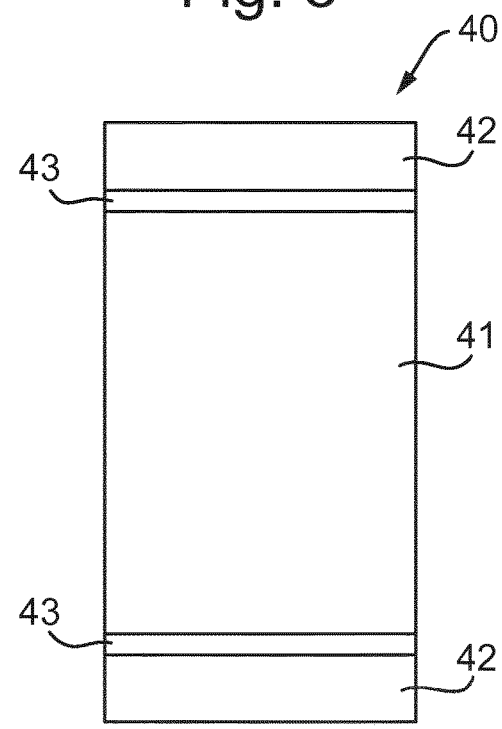

FIG. 8 depicts an alternative embodiment in which the stack comprises layers in the following order: a non-metallic layer 42, a silicon compound layer 43, a silicon layer 41, a silicon compound layer 43 and a non-metallic layer 42.

As depicted in FIG. 8 in an embodiment the membrane 40 comprises only one silicon layer 41. In such an embodiment the silicon layer 41 can have a thickness of at least 10 nm, optionally at least 20 nm, and optionally at least 38 nm. In an embodiment the single silicon layer 41 has a thickness of at most 100 nm, optionally at most 50 nm, and optionally at most 38 nm. The embodiment shown in FIG. 8 and having a silicon layer 41 of 38 nm thickness, non-metallic layer 42 of 4 nm thickness and silicon compound layer 43 of 2 nm thickness is expected to achieve an emissivity for EUV radiation of about 90%.

In an embodiment a total combined thickness of silicon compound layers 43 in the stack is at most about 20 nm. Metal and compounds having metallic properties improve the emissivity of the membrane 40 provided that the combined thickness is not too thick. For layers of metal or compounds having metallic properties that are too thick, the emissivity can be reduced.

Figure 9:
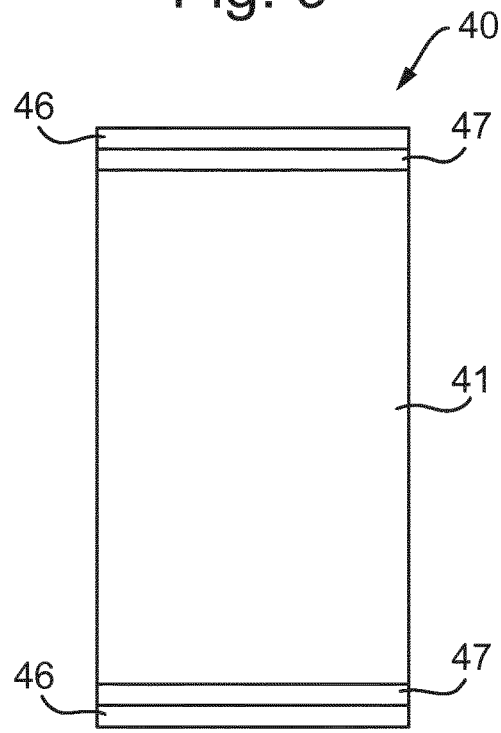

FIG. 9 schematically depicts an alternative embodiment of a membrane 40. As depicted in FIG. 9, in an embodiment the stack comprises at least one silicon layer 41, at least one capping layer 46 and at least one anti-migration layer 47. In an embodiment the capping layer 46 comprises ruthenium. The capping layer 46 is provided at an external surface of the membrane 40. The anti-migration layer 47 comprises at least one of molybdenum and titanium. The anti-migration layer 47 is adjacent to each capping layer 46.

The capping layer 46 comprising ruthenium improves the emissivity of the membrane 40. The capping layer 46 reduces the possibility of the membrane 40 oxidizing. The capping layer 46 is configured to protect the membrane 40 from hydrogen gas.

During use of the lithographic apparatus 100, the membrane 40 can heat up due to absorbing radiation. When the capping layer 46 heats up, the material (e.g. ruthenium) of the capping layer 46 can migrate. The migration is the transport of the material caused by the gradual movement of the ions in the capping layer 46. When the material starts to migrate, the material can form islands in the capping layer 46. When the material starts to migrate, the effectiveness of the capping layer 46 in reducing oxidation, protecting from hydrogen gas and improving emissivity is reduced. Hence, during use of the lithographic apparatus 100, the membrane 40 can start to oxidize and the emissivity can decrease.

By providing the anti-migration layer 47, migration of the capping layer 46 is reduced. Molybdenum and titanium are metals that have relatively high melting temperatures and good emissivity for UV radiation. Titanium and molybdenum do not migrate as much has ruthenium when they are heated. Titanium and molybdenum have good metal to metal contact with ruthenium. By providing the anti-migration layer 47 adjacent to the capping layer 46, migration of the capping layer 46 is reduced. As a result, even when the capping layer 46 is heated during use of the lithographic apparatus 100, the good properties of the capping layer 46 are retained at higher temperatures.

As depicted in FIG. 9, in an embodiment the stack comprises layers in the following order: a capping layer 46 comprising ruthenium at an external surface of the membrane 40, an anti-migration layer 47 comprising at least one of molybdenum and titanium, a silicon layer 41, an anti-migration layer 47 comprising at least one of molybdenum and titanium, and a capping layer 46 comprising ruthenium at the other external surface of the membrane 40. In an embodiment a capping layer 46 comprising ruthenium is provided at both external surfaces of the membrane 40.

Figure 10:
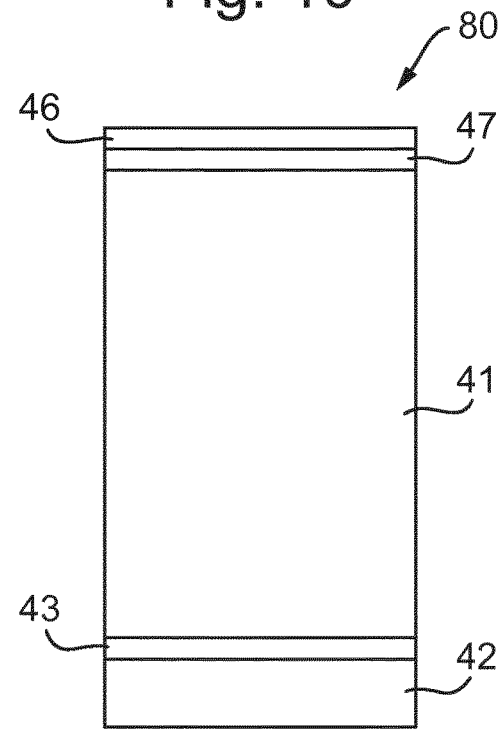

FIG. 10 depicts an alternative embodiment of a membrane in which the use of the anti-migration layer 47 is combined with the idea of using the silicon compound layer 43.

As depicted in FIG. 10 in an embodiment the stack comprises layers in the following order: a capping layer 46 comprising ruthenium at an external surface of the membrane 40, an anti-migration layer 47 comprising at least one of molybdenum and titanium, a silicon layer 41, a silicon compound layer 43 and a non-metallic layer 42.

During manufacture of the membrane assembly 80, the boron carbide layer can protect the silicon layer 41 chemically from etching processes. In an embodiment the membrane 40 comprises a periodic structure. In an embodiment the period is not set to be equal to 6.6 nm or 6.7 nm. If the period is at or close to 6.7 nm the membrane may act as a mirror for the EUV radiation.

Silicon can crystallise in a diamond cubic crystal structure. In an embodiment the border 81 comprises a cubic crystal of silicon. In an embodiment the border 81 has a <100> crystallographic direction.

In an embodiment the silicon layer 41 is formed from polycrystalline or nanocrystalline silicon. Polycrystalline or nanocrystalline silicon has a brittle nature. Hence, a membrane 40 that comprises a silicon layer 41 formed from polycrystalline or nanocrystalline silicon can shatter into many particles when the membrane assembly 80 breaks. An embodiment of the invention is expected to achieve an improvement in the mechanical properties of the membrane assembly 80.

Polycrystalline silicon and nanocrystalline silicon each have high transmission for EUV radiation. Polycrystalline silicon and nanocrystalline silicon each have good mechanical strength.

However, it is not essential for the membrane of the silicon layer 41 to be formed from polycrystalline or nanocrystalline silicon. For example, in an alternative embodiment the silicon layer 41 is formed from a multi-lattice membrane or a silicon nitride.

In a further alternative embodiment the silicon layer 41 is formed from monocrystalline silicon. In such an embodiment the monocrystalline silicon membrane can be formed by a silicon on insulator (SOI) technique. The starting material for this product is a so-called SOI substrate. An SOI substrate is a substrate comprising a silicon carrier substrate with a thin, monocrystalline silicon layer on top of a buried isolating $SiO_2$ layer. In an embodiment the thickness of the monocrystalline silicon layer can range between about 5 nm to about 5 μm. In an embodiment the silicon layer 41 is present on the SOI substrate before the SOI substrate is used in the method of manufacture.

In an embodiment the silicon layer 41 comprises silicon in one of its allotrope forms such as amorphous, monocrystalline, polycrystalline or nanocrystalline silicon. A nanocrystalline silicon means a polycrystalline silicon matrix containing a certain amorphous silicon content. In an embodiment polycrystalline or nanocrystalline silicon is formed by crystallising amorphous silicon in the silicon layer 41. For example, in an embodiment a silicon layer 41 is added to the stack as an amorphous silicon layer. The amorphous silicon layer crystallises into a polycrystalline or nanocrystalline silicon layer when a certain temperature is exceeded. For example, the silicon layer 41 as an amorphous silicon layer transforms into the silicon layer 41 as a polycrystalline or nanocrystalline silicon layer.

In an embodiment the amorphous silicon layer is in-situ doped during its growth. In an embodiment the amorphous silicon layer is doped after its growth. By adding a p- or n-type dopant the silicon conductivity increases, which has a positive effect on the thermomechanical behavior due to the power of the EUV source.

In an embodiment the membrane 40 is thin enough that its transmission for EUV radiation is sufficiently high, for example greater than 50%. In an embodiment the thickness of the membrane 40 is at most about 200 nm, and optionally at most about 150 nm. A 150 nm Si membrane would transmit about 77% of incident EUV radiation. In an embodiment the thickness of the membrane 40 is at most about 100 nm. A 100 nm Si membrane would transmit about 84% of incident EUV radiation. A 60 nm Si membrane would transmit about 90% of incident EUV radiation.

In an embodiment the membrane 40 is thick enough that it is mechanically stable when the membrane assembly 80 is fixed to the patterning device MA of the lithographic apparatus 100 and during use of the lithographic apparatus 100. In an embodiment the thickness of the membrane 40 is at least about 10 nm, optionally at least about 20 nm, and optionally at least about 35 nm. In an embodiment the thickness of the membrane 40 is about 55 nm.

Figure 11:
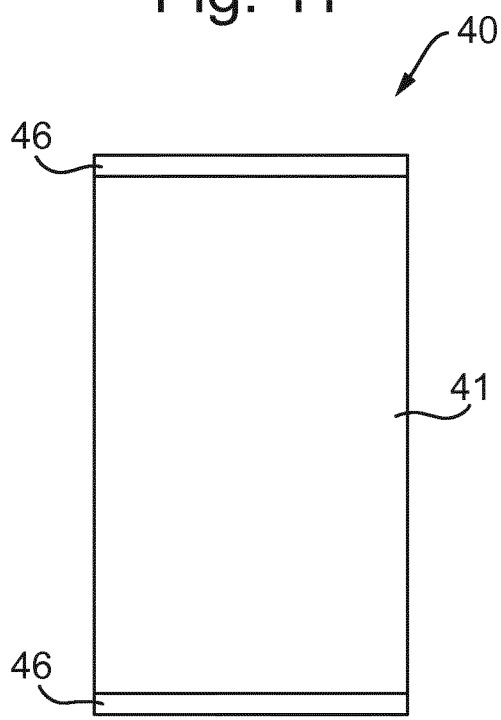
Figure 12:
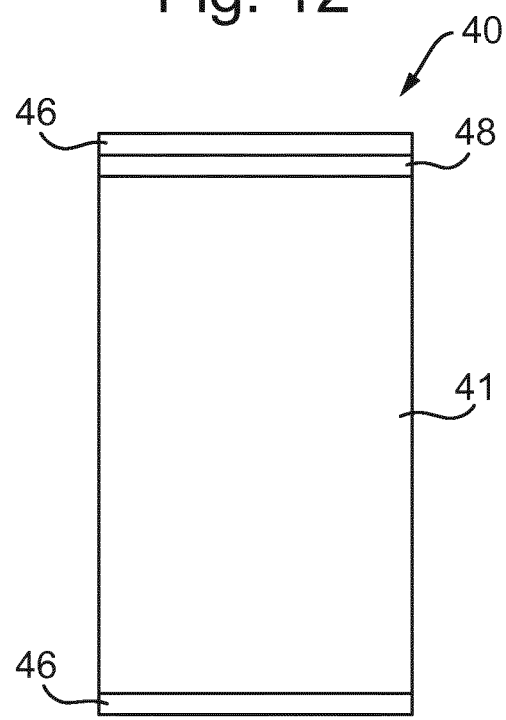
Figure 13:
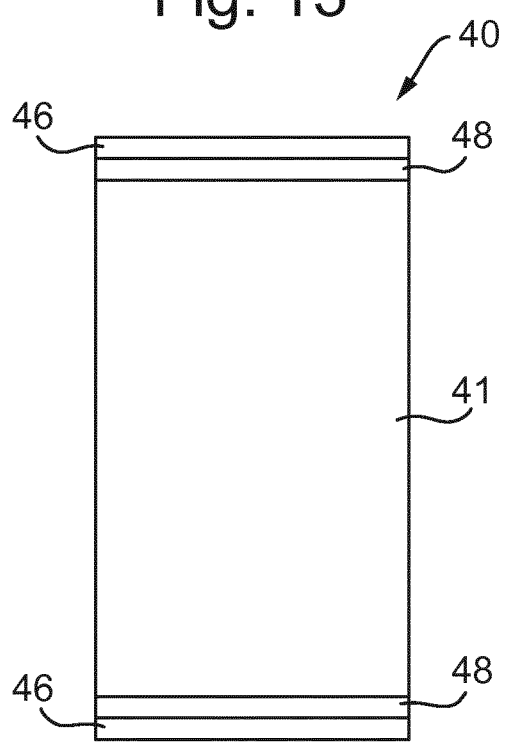

FIGS. 11 to 13 schematically depict, in cross-section, different embodiments of the membrane 40 according to the invention. When designing the membrane 40, there is a trade-off between the thickness of the membrane 40, its stability and its robustness.

As shown in FIG. 11, in an embodiment the membrane 40 comprises a silicon layer 41 sandwiched by two capping layers 46. In an embodiment the silicon layer 41 comprises polysilicon. In an embodiment the same (capping) material is used for the two capping layers 46. However, this is not necessarily the case. In alternative embodiments, the material used for one of the capping layers 46 is different from the material used for the other capping layer 46.

In an embodiment the capping layers 46 are at the external surfaces of the membrane 40. Hence, in an embodiment the stack comprises layers in the following order: a capping layer 46 at an external surface of the membrane 40, a silicon layer 41 and a capping layer 36 comprising a silicide of a transition metal.

In an embodiment the capping layers 46 comprises a silicide of a transition metal. The particular transition metal is not particularly limited but may be Zr, Y, Mo, Cr, Hf, Ir, Mn, Nb, Os, Pd, Pt, Re, Rh, Ru, Ta, Ti, V or W, for example.

A silicide of a transition metal transmits a particularly high proportion of EUV radiation. It is desirable for the transmission of the membrane 40 for EUV radiation to be as high as possible. In an embodiment the materials for the stack are chosen such that the extinction coefficient k is less that 0.0175 for EUV radiation having a wavelength of 13.5 nm.

The extinction coefficient k is related to the EUV transmission. When EUV radiation passes through a medium, some part of the EUV radiation is attenuated. This can be conveniently taken into account by defining a complex refractive index $ñ=n+ik$.

Here, the real part n of the complex refractive index is the refractive index and indicates the phase velocity. The extinction coefficient k is the imaginary part of the complex refractive index. The extinction coefficient k indicates the amount of attenuation when the electromagnetic wave propagates through the material.

In the description above, the value of the extinction coefficient k is given for radiation having a wavelength of 13.5 nm. Using this value and a given material thickness we can calculate the EUV transmission/absorption of a layer within the membrane 40. For a layer of material having a specific value of the extinction coefficient k=0.0175, a 4 nm thickness layer absorbs 6% of the EUV radiation (i.e. 6% EUV transmission loss).

It is not necessary for the capping layers 46 to comprise a transition metal silicide. In alternative embodiments, one or both of the capping layers 46 comprise a boride of the transition metal, a carbide of the transition metal, a nitride of the transition metal, an oxide of the transition metal or a pure form of the transition metal.

Table 1 shows the value of the melting temperature, the coefficient of thermal expansion (CTE), the resistivity of the membrane, the EUV radiation transmission, the capping layer thickness d in nm corresponding to a loss of 6% EUV transmission, the real part n of the complex refractive index for radiation having a wavelength of 13.5 nm and the value of the extinction coefficient k for radiation having a wavelength of 13.5 nm, for a selection of suitable capping layer materials in decreasing order of their EUV transmission value.

Examples of suitable capping layer materials are (in decreasing order of their EUV transmission value from 99.8% to 94.6%): Si, Y, YSi2, LaSi2, ZrSi2, SiB4, B, Zr, YB6, NbSi3, MoSi2, YC2, SiC, ZrB2, La, CeSi2, B4C, Nb, CeB6, LaB6, NbB2, ZrC, Ce, Mo, CeC2, YN, LaC2, MoB, LaN, C, Mo2C, NbC, TiSi2, Ru2Si3, Si3N6, BN, ZrN, VSi2, CeN, RuB2, NbN, SiO2, Y2O3, MoN, TiB2, La2O3, Nb2O5, WSi2, Ti, ZrO2, B2O3, MoO3, TiC, RuC, SiCr, Ru, WB2, VB2, TaSi2, CeO2, TiN, RuN, RuO2, TiO3, VC, V, TaB2, VN, WC, CrB, TiW, CrN, W, HfO2, Cr3C2, WN, TaC, Ta2O5, TaN, Cr, Al2O3, Ta and Pt.

Preferred capping layers materials which may provide an optimal combination of melting temperature, resistivity, EUV transmission, refractive index n and extinction coefficient k are for example: CeB6, LaB6, NbSi3, Zr, YSi2, CeSi2, Y, CeC2, LaC2, LaSi2, ZrB2, Nb, LaN, YC2, ZrSi2, SiB4, B, YB6, MoSi2, YC2, SiC, La, B4C, Ce, CeN, Ru2Si3, YN, ZrC, NbB2, NbC, Mo2C, MoB and Mo.

TABLE 1

List of capping layer materials

| Material | Melting ° C. | CTE ppm | Resistivity Ω·m | EUVT/ nm (—/nm) | d for −6% EUVT (nm) | n @13.5 nm | k @13.5 nm |
|---|---|---|---|---|---|---|---|
| Si | 1414 | 4.0 | 2E+03 | 0.9983 | 36.4 | 0.9990 | 0.0018 |
| Y | 1526 | 10.6 | 6E−07 | 0.9979 | 29.2 | 0.9738 | 0.0023 |
| YSi2 | 1835 | | | 0.9977 | 26.6 | 0.9802 | 0.0025 |
| LaSi2 | | | | 0.9976 | 25.2 | 0.9986 | 0.0026 |
| ZrSi2 | 1620 | | 3E−04 | 0.9972 | 21.8 | 0.9802 | 0.0032 |
| SiB4 | 1950 | | 2E−03 | 0.9968 | 19.4 | 0.9789 | 0.0034 |
| B | 2076 | 6.0 | 1E+06 | 0.9966 | 18.4 | 0.9719 | 0.0036 |
| Zr | 1855 | 5.7 | 4E−07 | 0.9965 | 17.7 | 0.9589 | 0.0038 |
| YB6 | 2300 | | 4E−04 | 0.9965 | 17.6 | 0.9666 | 0.0038 |
| NbSi3 | 1950 | | | 0.9964 | 17.3 | 0.9716 | 0.0038 |
| MoSi2 | 2030 | 8.0 | 3E−03 | 0.9960 | 15.5 | 0.9696 | 0.0043 |
| YC2 | | | | 0.9959 | 15.0 | 0.9655 | 0.0044 |
| SiC | 2730 | 4.0 | 1E+00 | 0.9956 | 13.9 | 0.9822 | 0.0048 |
| ZrB2 | 3246 | 7.0 | 4E−05 | 0.9955 | 13.7 | 0.9532 | 0.0049 |
| La | 920 | 12.1 | 6E−07 | 0.9954 | 13.4 | 0.9974 | 0.0050 |
| CeSi2 | 1620 | | | 0.9954 | 13.3 | 1.0032 | 0.0050 |
| B4C | 2763 | 5.0 | 1E−02 | 0.9952 | 12.9 | 0.9638 | 0.0051 |
| Nb | 2477 | 7.3 | 1E−07 | 0.9952 | 12.8 | 0.9337 | 0.0052 |
| CeB6 | 2552 | | | 0.9947 | 11.7 | 0.9826 | 0.0057 |
| LaB6 | 2210 | | | 0.9952 | 12.8 | 0.9783 | 0.0052 |
| NbB2 | 2900 | | 1E−06 | 0.9947 | 11.6 | 0.9385 | 0.0057 |
| ZrC | 3532 | | 4E−07 | 0.9945 | 11.3 | 0.9488 | 0.0059 |
| Ce | 795 | 6.3 | 8E−07 | 0.9942 | 10.7 | 1.0065 | 0.0062 |
| Mo | 2623 | 4.8 | 5E−08 | 0.9940 | 10.3 | 0.9233 | 0.0065 |
| CeC2 | 2420 | | | 0.9940 | 10.2 | 0.9909 | 0.0065 |
| YN | | | | 0.9937 | 9.9 | 0.9571 | 0.0067 |
| LaC2 | 2360 | | | 0.9937 | 9.8 | 0.9826 | 0.0068 |
| MoB | 2600 | | | 0.9937 | 9.7 | 0.9258 | 0.0068 |
| LaN | | | | 0.9937 | 9.7 | 0.9883 | 0.0068 |
| C | 3642 | | 5E−04 | 0.9936 | 9.6 | 0.9616 | 0.0069 |
| Mo2C | 2650 | | | 0.9934 | 9.3 | 0.9261 | 0.0071 |
| NbC | 3490 | 6.2 | | 0.9935 | 9.5 | 0.9308 | 0.0070 |
| TiSi2 | 1470 | | 1E−03 | 0.9931 | 8.9 | 0.9795 | 0.0075 |
| Ru2Si3 | | | | 0.9929 | 8.6 | 0.9578 | 0.0077 |
| Si3N6 | 1900 | 2.0 | 1E+06 | 0.9920 | 7.7 | 0.9750 | 0.0087 |
| BN | 2973 | | 1E+12 | 0.9918 | 7.5 | 0.9627 | 0.0088 |
| ZrN | 2952 | 6.0 | 1E−07 | 0.9918 | 7.5 | 0.9434 | 0.0088 |

A suicide of a transition metal transmits a higher proportion of EUV radiation compared to a boride of the transition metal, a carbide of the transition metal, a nitride of the transition metal, an oxide of the transition metal or a pure form of the transition metal.

With respect to EUV transmission properties, possible materials of the membrane 40 have the following ranking, with the material that transmits the highest proportion of EUV radiation given first: a transition metal silicide, a transition metal boride, a pure transition metal, a transition metal carbide, a transition metal nitride and a transition metal oxide. Depending on the transition metal, the pure transition metal may be better than the transition metal boride. Depending on the transition metal, the transition metal carbide may be better than the pure transition metal. An example of a carbide of a transition metal is molybdenum carbide.

Furthermore, a silicide of a transition metal has particularly desirable EUV reflection properties. It is desirable for EUV reflection (i.e. the proportion of EUV radiation that is reflected at the surface of the membrane 40) to be as low as possible. A silicide of a transition metal reflects a lower proportion of EUV radiation compared to an oxide of the transition metal, a boride of the transition metal, a carbide of the transition metal, a nitride of the transition metal or a pure form of the transition metal.

In an embodiment the materials of the stack of the membrane 40 are selected such that the refractive index of the stack is greater than 0.95 for EUV radiation having a wavelength of 13.5 nm. A refractive index of close to 1 limits EUV reflections the interface of the membrane 40.

With respect to EUV reflection properties, possible materials of the membrane 40 have the following ranking, with the material that reflects the lowest proportion of EUV radiation given first: a transition metal silicide, a transition metal oxide, a pure transition metal, a transition metal boride, a transition metal carbide and a transition metal nitride. However, there is no significant difference with regard to EUV reflection properties between the transition metal oxide, the pure transition metal, the transition metal boride and the transition metal carbide.

It is desirable for the resistivity of the membrane 40 to be low. In particular it is desirable for the resistivity of the capping layers 46 to be low. This is because conductive coatings enable increased resistivity for the membrane 40. A silicide of a transition metal has a resistivity that is lower than a carbide of the transition metal, a nitride of the transition metal or an oxide of the transition metal.

In an embodiment the materials for the capping layers 46 are selected such that the resistivity of the capping layers 46 is less than $10^{-3}$ Ω·m.

With respect to resistivity, possible materials for the membrane 40 have the following ranking, with the material having the lowest resistivity given first: a pure transition metal, a transition metal boride, a transition metal silicide, a transition metal carbide, a transition metal nitride and a transition metal oxide.

During use of the membrane 40, the membrane 40 may reach an operating temperature of up to about 600° C. Accordingly, it is desirable for the melting point of the materials used in the stack for the membrane 40 to be high. In an embodiment the materials of the stack are selected such that their melting temperature is greater than 1200° C.

With respect to melting point, possible materials for the membrane 40 have the following ranking, with the material having the highest melting point given first: a transition metal carbide, a transition metal boride, a transition metal nitride, a pure transition metal, a transition metal oxide and a transition metal silicide. Depending on the transition metal, the transition metal boride may have a higher melting point than the transition metal carbide. Depending on the transition metal, the transition metal oxide may have a higher melting point than the pure transition metal.

In an embodiment the materials for the layers other than the silicon layer 41 are selected such that their coefficient of thermal expansion is close to the coefficient of thermal expansion for the silicon layer 41. The coefficient of thermal expansion for the silicon layer 41 may be in the region of about $2.6 \times 10^{-6}$ m/m·K. Matching the coefficient thermal expansion to that of the silicon layer 41 at the core of the membrane 40 reduces the possibility of thermomechanical failure of the membrane 40. In an embodiment the materials of the stack are selected such that their coefficient of thermal expansion is in the range of from about $2 \times 10^{-6}$ m/m·K to about $6 \times 10^{-6}$ m/m·K.

With regard to coefficient thermal expansion, the ranking of the possible materials for the membrane 40 depends fully on the specific compounds.

As depicted in FIG. 12, in an embodiment a transition metal layer 48 is provided between the silicon layer 41 and one of the capping layers 46. The transition metal layer 48 comprises a transition metal. For example, the transition metal may be Zr, Y, Mo, Cr, Hf, Ir, Mn, Nb, Os, Pd, Pt, Re, Rh, Ru, Ta, Ti, V or W. In an embodiment the transition metal in the transition metal layer 48 is provided in its pure form (i.e. not as a silicide, a boride, a carbide, a nitride or an oxide of the transition metal). Accordingly, in an embodiment the stack of the membrane 40 comprises, in order, a capping layer 46, a transition metal layer 48, a silicon layer and a capping layer 46.

In an embodiment the capping layers 46 comprise a boride, a carbide (e.g. molybdenum carbide), a nitride or an oxide of a transition metal. The transition metal in the transition metal layer 48 may be the same as the transition metal capping layers 46. In an alternative embodiment the transition metal of the transition metal layer 48 is different from the transition metal used in the capping layers 46.

As depicted in FIG. 13 in an embodiment a transition metal layer 48 is provided on either side of the silicon layer 41. A transition metal layer 48 is provided between the silicon layer 41 and each of the capping layers 46. Accordingly, in an embodiment the stack of the membrane 40 comprises, in order, a capping layer 46, a transition metal layer 48, a silicon layer, a transition metal layer 48 and a capping layer 46.

When selecting which materials to use for the membrane 40, there is a trade off between the properties identified above, namely EUV transmission, EUV reflection, melting point, coefficient of thermal expansion and resistivity.

The ranking of possible stacks for the membrane 40 based on the capping layers 46 using the criteria as specified above can be summarised in table 2, with 1 indicating the best ranking, 2 indicating the next best ranking etc. Where different stacks are given the same ranking (e.g. there are three different stacks given the ranking 2), those stacks are considered to be equally good. In the table, M represents a transition metal and pSi(core) represents polysilicon as the silicon layer 41 at the core of the membrane 40. The symbol "I" represents where one layer ends and another layer begins.

In an embodiment, the boride is non-conducting (e.g. B). In an embodiment the carbide is non-conducting (e.g. $B_4C$ or SiC). In an embodiment, the nitride is non-conducting (e.g. SiN). Any of the above listed capping layer materials may be suitable in combinations represented in table 2. Examples of such membrane stacks which are thermally, mechanically and chemically resistant (e.g. to EUV radiation and H2 exposure) at temperatures up to 450° C. are for example $ZrO_2$/SiN/pSi/SiN/Mo/Ru and B/(SiN)/pSi/(SiN)/Mo/B. For instance, in the stack comprising B/SiN/pSi/SiN/Zr/B, the cap layer combination Zr and B reduced the membrane sensitivity to EUV reflection (EUVR) to below 0.04% and it allowed EUV transmission of 87-88%. In the membrane stack B/pSi/B/Zr/B stack: B is a capping layer, but also acts a diffusion barrier layer; while Zr is an emissive layer.

TABLE 2

Examples of preferred membrane stack architectures

| | |
|---|---|
| 1 | M-silicide/pSi(core)/M-silicide |
| 2 | M-boride/pSi(core)/M-boride |
| | M-boride/M/pSi(core)/M-boride |
| | M-boride/M/pSi(core)/M/M-boride |
| 3 | M-carbide/pSi(core)/M-carbide |
| | M-carbide/M/pSi(core)/M-carbide |
| | M-carbide/M/pSi(core)/M/M-carbide |
| 4 | M-nitride/pSi(core)/M-nitride |
| | M-nitride/M/pSi(core)/M-nitride |
| | M-nitride/M/pSi(core)/M/M-nitride |
| 5 | M-oxide/pSi(core)/M-oxide |
| | M-oxide/M/pSi(core)/M/M-oxide |

In an embodiment the stack of the membrane 40 comprises a diffusion barrier layer. The thickness of the diffusion barrier layer is preferably less than 1 nm to minimize EUV loss. The diffusion barrier layer is between the transition metal layer 48 and the silicon layer 41 or silicon compound layer 43. The diffusion barrier layer is configured to reduce intermixing and/or reactions between the transition metal of the transition metal layer 48 and the silicon layer 41 or silicon compound layer 43. For example in an embodiment the diffusion barrier layer is configured to reduce or prevent silicidation between the transition metal and the underlying silicon core material. Intermixing or reactions between the transition metal and the silicon can undesirably change the properties of the membrane 40. For example, the emissivity of the membrane 40 could be undesirably reduced and/or there could be a change in the physical stress of the membrane 40.

In an embodiment the diffusion barrier layer comprises a material selected from the group consisting of B, B4C, C, Cr, Mg, Mo, Re, Ta, Ti, V, W and a nitride of any of B, B4C, C, Cr, Mg, Mo, Re, Ta, Ti, V and W.

In an embodiment the membrane assembly 80 is applied as a pellicle or as part of a dynamic gas lock. Alternatively, the membrane assembly 80 can be applied in other filtration areas such as illumination, or for beam splitters. In an embodiment the dynamic gas lock is configured to block debris within the lithographic apparatus 100. In an embodiment the dynamic gas lock is positioned between the projection system PS and the substrate W. The dynamic gas lock reduces the possibility of particles from the substrate W or from near the substrate W reaching optical components in or around the projection system PS. Similarly, the dynamic gas lock can protect the illumination system IL. In an alternative embodiment the dynamic gas lock is positioned at the virtual source point IF. For example, the dynamic gas lock may be positioned between the source collector module SO and the illumination system IL.

Embodiments of the invention are described in the clauses set out below;

1. A membrane for EUV lithography, the membrane having a thickness of no more than 200 nm and comprising a stack comprising:
   at least one silicon layer; and
   at least one silicon compound layer made of a compound of silicon and an element selected from the group consisting of boron, phosphorous, bromine and sulphur.
2. The membrane of clause 1, wherein the silicon compound layer is formed as an interlayer between the silicon layer and a non-metallic layer comprising the element.
3. The membrane of clause 1 or clause 2, wherein the stack comprises:
   a plurality of silicon layers;
   a plurality of non-metallic layers; and
   a silicon compound layer between each pair of a silicon layer and a non-metallic layer;
      wherein each non-metallic layer comprises an element selected from the group consisting of boron, phosphorous, bromine and sulphur,
      wherein each silicon compound layer is made of a compound of silicon and an element selected from the group consisting of boron, phosphorous, bromine and sulphur.
4. The membrane of any preceding clause, wherein the stack comprises layers in the following order;
   a non-metallic layer;
   a silicon compound layer;
   a silicon layer;

a silicon compound layer;
a non-metallic layer;
a silicon compound layer;
a silicon layer;
a silicon compound layer;
a non-metallic layer;
a silicon compound layer;
a silicon layer;
a silicon compound layer; and
a non-metallic layer;
wherein each non-metallic layer comprises an element selected from the group consisting of boron, phosphorous, bromine and sulphur,
wherein each silicon compound layer is made of a compound of silicon and an element selected from the group consisting of boron, phosphorous, bromine and sulphur.

5. The membrane of any of clauses 1 to 3, wherein the stack comprises layers in the following order:
a non-metallic layer;
a silicon compound layer;
a silicon layer;
a silicon compound layer; and
a non-metallic layer;
wherein each non-metallic layer comprises an element selected from the group consisting of boron, phosphorous, bromine and sulphur,
wherein each silicon compound layer is made of a compound of silicon and an element selected from the group consisting of boron, phosphorous, bromine and sulphur.

6. The membrane of any preceding clause, wherein a total combined thickness of silicon compound layer(s) in the stack is at most about 20 nm.

7. The membrane of any preceding clause, wherein each silicon compound layer has a thickness of at least 1 nm.

8. The membrane of any preceding clause, wherein the stack comprises:
at least one capping layer comprising ruthenium at an external surface of the membrane; and
at least one anti-migration layer comprising at least one of molybdenum and titanium adjacent to each capping layer.

9. The membrane of clause 8, wherein a capping layer comprising ruthenium is at both external surfaces of the membrane.

10. The membrane of any of clauses 1 to 7, wherein the stack comprises at least one capping layer at an external surface of the membrane, each capping layer comprising a material selected from the group consisting of a transition metal silicide, a transition metal boride, a transition metal carbide, a transition metal nitride and a transition metal oxide.

11. The membrane of clause 10, wherein the capping layer materials is selected from: Si, Y, $YSi_2$, $LaSi_2$, $ZrSi_2$, $SiB_4$, B, Zr, $YB_6$, $NbSi_3$, $MoSi_2$, $YC_2$, SiC, $ZrB_2$, La, $CeSi_2$, $B_4C$, Nb, $CeB_6$, $LaB_6$, $NbB_2$, ZrC, Ce, Mo, $CeC_2$, YN, $LaC_2$, MoB, LaN, C, $Mo_2C$, NbC, $TiSi_2$, $Ru_2Si_3$, $Si_3N_4$, BN, ZrN, $VSi_2$, CeN, $RuB_2$, NbN, $SiO_2$, $Y_2O_3$, MoN, $TiB_2$, $La_2O_3$, $Nb_2O_5$, $WSi_2$, Ti, $ZrO_2$, $B_2O_3$, $MoO_3$, TiC, RuC, SiCr, Ru, $WB_2$, $VB_2$, $TaSi_2$, $CeO_2$, TiN, RuN, $RuO_2$, $TiO_3$, VC, V, $TaB_2$, VN, WC, CrB, TiW, CrN, W, $HfO_2$, $Cr_3C_2$, WN, TaC, $Ta_2O_5$, TaN, Cr, $Al_2O_3$, Ta and Pt.

12. The membrane of clause 10 and 11, wherein the capping layer materials is selected from: $CeB_6$, $LaB_6$, $NbSi_3$, Zr, $YSi_2$, $CeSi_2$, Y, $CeC_2$, $LaC_2$, $LaSi_2$, $ZrB_2$, Nb, LaN, $YC_2$, $ZrSi_2$, $SiB_4$, B, $YB_6$, $MoSi_2$, $YC_2$, SiC, La, $B_4C$, Ce, CeN, $Ru_2Si_3$, YN, ZrC, $NbB_2$, NbC, $Mo_2C$, MoB and Mo.

13. The membrane of clause 10, wherein the stack comprises at least one transition metal layer between a capping layer and the silicon layer, each transition metal layer comprising a transition metal selected from the group consisting of Zr, Y, Mo, Cr, Hf, Ir, Mn, Nb, Os, Pd, Pt, Re, Rh, Ru, Ta, Ti, V and W.

14. The membrane of clause 11, wherein the stack comprises a diffusion barrier layer between the transition metal layer and the silicon layer, the diffusion barrier layer configured to reduce intermixing and/or reactions between the transition metal of the transition metal layer and the silicon layer.

15. The membrane of clause 12, wherein the diffusion barrier layer comprises a material selected from the group consisting of B, $B_4C$, C, Cr, Mg, Mo, Re, Ta, Ti, V, W and a nitride of any of B, $B_4C$, C, Cr, Mg, Mo, Re, Ta, Ti, V and W.

16. A membrane for EUV lithography, the membrane comprising a stack comprising:
at least one silicon layer;
at least one capping layer comprising ruthenium at an external surface of the membrane; and
at least one anti-migration layer comprising at least one of molybdenum and titanium adjacent to each capping layer.

17. The membrane of clause 16, wherein a capping layer comprising ruthenium is at both external surfaces of the membrane.

18. The membrane of clause 17, wherein the stack comprises layers in the following order:
a capping layer comprising ruthenium at an external surface of the membrane;
an anti-migration layer comprising at least one of molybdenum and titanium;
a silicon layer;
an anti-migration layer comprising at least one of molybdenum and titanium; and
a capping layer comprising ruthenium at the other external surface of the membrane.

19. The membrane of clause 16 or clause 17, wherein the stack comprises at least one silicon compound layer made of a compound of silicon and an element selected from the group consisting of boron, phosphorous, bromine and sulphur.

20. The membrane of clause 19, wherein the silicon compound layer is formed as an interlayer between the silicon layer and a non-metallic layer comprising the element.

21. The membrane of clause 19 or clause 20, wherein the stack comprises layers in the following order:
a capping layer comprising ruthenium at an external surface of the membrane;
an anti-migration layer comprising at least one of molybdenum and titanium;
a silicon layer;
a silicon compound layer; and
a non-metallic layer;
wherein the silicon compound layer is made of a compound of silicon and an element selected from the group consisting of boron, phosphorous, bromine and sulphur,
wherein the non-metallic layer comprises an element selected from the group consisting of boron, phosphorous, bromine and sulphur.

22, A membrane for EUV lithography, the membrane having a thickness of no more than 200 nm and comprising a stack comprising:
at least one silicon layer and/or at least one silicon compound layer made of a compound of silicon and an element selected from the group consisting of boron, phosphorous, bromine and sulphur; and at least one capping layer at an external surface of the membrane, each capping layer comprising a material selected from the group consisting of a transition metal silicide, a transition metal boride, a transition metal carbide, a transition metal nitride and a transition metal oxide; and/or at least one transition metal layer between a capping layer and the silicon layer or silicon compound layer, each transition metal layer comprising a transition metal selected from the group consisting of Zr, Y, Mo, Cr, Hf, Ir, Mn, Nb, Os, Pd, Pt, Re, Rh, Ru, Ta, Ti, V and W.

23. The membrane of clause 22, comprising a stack of $ZrO_2$/SiN/pSi/SiN/Mo/Ru.

24. The membrane of clause 22, comprising a stack of B/SiN/pSi/SiN/Mo/B.

25. The membrane of clause 22, wherein the stack comprises a diffusion barrier layer between the transition metal layer and the silicon layer or silicon compound layer, the diffusion barrier layer configured to reduce intermixing and/or reactions between the transition metal of the transition metal layer and the silicon layer or silicon compound layer.

26. The membrane of clause 25, wherein the diffusion barrier layer comprises a material selected from the group consisting of B, $B_4C$, C, Cr, Mg, Mo, Re, Ta, Ti, V, W and a nitride of any of B, $B_4C$, C, Cr, Mg, Mo, Re, Ta, Ti, V and W.

27. The membrane of any of clauses 22 to 24, wherein the silicon compound layer is formed as an interlayer between the silicon layer and a non-metallic layer comprising the element.

28. The membrane of any of clauses 16 to 27, wherein each silicon compound layer has a thickness of at least 1 nm.

29. The membrane of any of clauses 16 to 21, having a thickness of no more than 200 nm.

30. A patterning device assembly for EUV lithography comprising the membrane of any preceding clause.

31. A dynamic gas lock assembly for EUV lithography comprising the membrane of any preceding clause.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The substrate referred to herein may be processed, before or after exposure, in for example a track (a tool that typically applies a layer of resist to a substrate and develops the exposed resist), a metrology tool and/or an inspection tool.

Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the various photo resist layers may be replaced by non-photo resist layers that perform the same function.

The descriptions above are intended to be illustrative, not limiting. Thus it will be apparent to one skilled in the art that modifications may be made to the invention as described without departing from the scope of the claims set out below.

The invention claimed is:

1. A membrane for EUV radiation lithography, the membrane having a thickness of no more than 200 nm and comprising a stack comprising:
   at least one silicon layer to receive EUV radiation;
   at least one silicon compound layer made of a compound of silicon and an element selected from the group consisting of boron, phosphorous, bromine and sulphur; and
   at least one non-metallic layer comprising the element, wherein a silicon compound layer of the at least one silicon compound layer is formed as an interlayer between a silicon layer of the at least one silicon layer and a non-metallic layer of the at least one non-metallic layer.

2. The membrane of claim 1, wherein:
   the at least one silicon layer comprise a plurality of silicon layers;
   the at least one non-metallic layer comprises a plurality of non-metallic layers; and
   the at least one silicon compound layer comprises a plurality of silicon compound layers, a silicon compound layer of the plurality of silicon compound layers between each pair of a silicon layer of the plurality of silicon layers and a non-metallic layer of the plurality of non-metallic layers,
   wherein each non-metallic layer of the plurality of non-metallic layers comprises an element selected from the group consisting of boron, phosphorous, bromine and sulphur, and
   wherein each silicon compound layer of the plurality of silicon compound layers is made of a compound of silicon and an element selected from the group consisting of boron, phosphorous, bromine and sulphur.

3. The membrane of claim 1, wherein the stack comprises layers in the following order:
   a first non-metallic layer of the at least one non-metallic layer;
   a first silicon compound layer of the at least one silicon compound layer;
   a silicon layer;
   a second silicon compound layer of the at least one silicon compound layer; and
   a second non-metallic layer of the at least one non-metallic layer,
   wherein each of the first and second non-metallic layers comprises an element selected from the group consisting of boron, phosphorous, bromine and sulphur, and
   wherein each of the first and second silicon compound layers is made of a compound of silicon and an element selected from the group consisting of boron, phosphorous, bromine and sulphur.

4. The membrane of claim 1, wherein the stack comprises:
   at least one capping layer comprising ruthenium, at an external surface of the membrane; and
   at least one anti-migration layer comprising molybdenum and/or titanium, adjacent to each capping layer.

5. The membrane of claim 1, wherein the stack comprises at least one capping layer at an external surface of the membrane, each capping layer comprising a material selected from the group consisting of a transition metal silicide, a transition metal boride, a transition metal carbide, a transition metal nitride and a transition metal oxide.

6. The membrane of claim 5, wherein the capping layer material is selected from: Si, Y, $YSi_2$, $LaSi_2$, $ZrSi_2$, $SiB_4$, B, Zr, $YB_6$, $NbSi_3$, $MoSi_2$, $YC_2$, SiC, $ZrB_2$, La, $CeSi_2$, $B_4C$, Nb, $CeB_6$, $LaB_6$, $NbB_2$, ZrC, Ce, Mo, $CeC_2$, YN, $LaC_2$, MoB, LaN, C, Mo$_2$C, NbC, TiSi$_2$, Ru$_2$Si$_3$, Si$_3$N$_6$, BN, ZrN, VSi$_2$, CeN, RuB$_2$, NbN, SiO$_2$, Y$_2$O$_3$, MoN, TiB$_2$, La$_2$O$_3$, Nb$_2$O$_5$, WSi$_2$, Ti, ZrO$_2$, B$_2$O$_3$, MoO$_3$, TiC, RuC, SiCr, Ru, WB$_2$, VB$_2$, TaSi$_2$, CeO$_2$, TiN, RuN, RuO$_2$, TiO$_3$, VC, V, TaB$_2$, VN, WC, CrB, TiW, CrN, W, HfO$_2$, Cr$_3$C$_2$, WN, TaC, Ta$_2$O$_5$, TaN, Cr, Al$_2$O$_3$, Ta and Pt.

7. The membrane of claim 6, wherein the stack comprises at least one transition metal layer between a capping layer of the at least one capping layer and a silicon layer of the at least one silicon layer, each transition metal layer comprising a transition metal selected from the group consisting of Zr, Y, Mo, Cr, Hf, Ir, Mn, Nb, Os, Pd, Pt, Re, Rh, Ru, Ta, Ti, V and W.

8. A patterning device assembly for EUV lithography, the patterning device assembly comprising the membrane of claim 1.

9. A dynamic gas lock assembly for EUV lithography, the dynamic gas lock assembly comprising the membrane of claim 1.

10. A membrane for EUV radiation lithography, the membrane comprising a stack comprising:
at least one silicon layer to receive EUV radiation;
at least one capping layer comprising ruthenium, at an external surface of the membrane; and
at least one anti-migration layer comprising molybdenum and/or titanium, an anti-migration layer of the at least one anti-migration layer adjoining to each capping layer.

11. The membrane of claim 10, wherein the stack comprises layers in the following order:
a capping layer of the at least one capping layer, at an external surface of the membrane;
an anti-migration layer of the at least one anti-migration layer;
a silicon layer of the at least one silicon layer;
an anti-migration layer of the at least one silicon compound layer; and
a capping layer of the at least one capping layer, at another other external surface of the membrane.

12. The membrane of claim 11, wherein the stack comprises at least one silicon compound layer made of a compound of silicon and an element selected from the group consisting of boron, phosphorous, bromine and sulphur.

13. The membrane of claim 12, wherein the at least one silicon compound layer is formed as an interlayer between a silicon layer of the at least one silicon layer and a non-metallic layer comprising the element.

14. The membrane of claim 13, wherein the stack comprises layers in the following order:
a capping layer of the at least one capping layer, at an external surface of the membrane;
an anti-migration layer of the at least one anti-migration layer;
a silicon layer of the at least one silicon layer;
a silicon compound layer of the at least one silicon compound layer; and
a non-metallic layer,
wherein the silicon compound layer of the at least one silicon compound layer is made of a compound of silicon and an element selected from the group consisting of boron, phosphorous, bromine and sulphur, and
wherein the non-metallic layer comprises an element selected from the group consisting of boron, phosphorous, bromine and sulphur.

15. A patterning device assembly for EUV lithography, the patterning device assembly comprising the membrane of claim 10.

16. A membrane for EUV lithography, the membrane having a thickness of no more than 200 nm and comprising a stack comprising:
at least one silicon layer and/or at least one silicon compound layer made of a compound of silicon and an element selected from the group consisting of boron, phosphorous, bromine and sulphur, the at least one silicon layer and/or at least one silicon compound layer to receive EUV radiation; and
at least one capping layer at an external surface of the membrane, each capping layer comprising a material selected from the group consisting of a transition metal silicide, a transition metal boride, a transition metal carbide, a transition metal nitride and a transition metal oxide and the selected transition metal silicide, transition metal boride, transition metal carbide, transition metal nitride or transition metal oxide comprising a transition metal selected from the group consisting of Zr, Y, Cr, Hf, Ir, Mn, Nb, Os, Pd, Pt, Re, Rh, Ru, Ta, Ti, V and W, and/or
at least one transition metal layer adjoining, and between, a capping layer and a silicon layer of the at least one silicon layer and/or a silicon compound layer of the at least one silicon compound layer, each transition metal layer comprising a transition metal selected from the group consisting of Zr, Y, Mo, Cr, Hf, Ir, Mn, Nb, Os, Pd, Pt, Re, Rh, Ru, Ta, Ti, V and W.

17. The membrane according to claim 16, comprising a stack of ZrO2/SiN/pSi/SiN/Mo/Ru or a stack of B/SiN/pSi/SiN/Mo/B.

18. The membrane of claim 16, wherein the stack comprises a diffusion barrier layer between a transition metal layer of the at least one transition metal layer and the silicon layer of the at least one silicon layer or silicon compound layer of the at least one silicon compound layer, the diffusion barrier layer configured to reduce intermixing and/or reactions between the transition metal of the transition metal layer and the silicon layer of the at least one silicon layer or silicon compound layer of the at least one silicon compound layer.

19. The membrane of claim 18, wherein the diffusion barrier layer comprises a material selected from the group consisting of B, B$_4$C, C, Cr, Mg, Mo, Re, Ta, Ti, V, W and a nitride of any of B, B$_4$C, C, Cr, Mg, Mo, Re, Ta, Ti, V and W.

20. The membrane of claim 16, comprising the at least one silicon layer and the at least silicon compound layer and wherein a silicon compound layer of the at least one silicon compound layer is formed as an interlayer between a silicon layer of the at least one silicon layer and a non-metallic layer comprising said element.

21. The membrane of claim 16, comprising the at least one capping layer at an external surface of the membrane, each capping layer comprising a material selected from the group consisting of a transition metal silicide, a transition metal boride, a transition metal carbide, a transition metal nitride and a transition metal oxide and the selected transition metal silicide, transition metal boride, transition metal carbide, transition metal nitride or transition metal oxide comprising a transition metal selected from the group consisting of Zr, Y, Cr, Hf, Ir, Mn, Nb, Os, Pd, Pt, Re, Rh, Ru, Ta, Ti, V and W.

22. The membrane of claim 16, comprising the at least one transition metal layer adjoining and between a capping layer and the silicon layer and/or at least one silicon compound layer, each transition metal layer comprising a transition metal selected from the group consisting of Zr, Y, Mo, Cr, Hf, Ir, Mn, Nb, Os, Pd, Pt, Re, Rh, Ru, Ta, Ti, V and W.

* * * * *